(12) United States Patent
Dolmovich (10) Patent No.: US 6,191,536 B1
(45) Date of Patent: Feb. 20, 2001

(54) SOLID-STATE IGNITION SYSTEM USING TRUE VOLTAGE TRIGGERING

(75) Inventor: Bruce E. Dolmovich, Jacksonville, FL (US)

(73) Assignee: Unison Industries, Inc., Jacksonville, FL (US)

(*) Notice: Under 35 U.S.C. 154(b), the term of this patent shall be extended for 0 days.

(21) Appl. No.: 08/351,874

(22) Filed: Dec. 8, 1994

Related U.S. Application Data (63) Continuation of application No. 07/943,928, filed on Sep. 11, 1992, now abandoned.

(51) Int. Cl.[7] .................................................. H05B 37/02
(52) U.S. Cl. ........................ 315/209 CD; 315/209 SC; 60/39.827; 361/256
(58) Field of Search ........................... 361/247, 253, 361/254, 256, 257; 60/39.827; 315/209 CD, 209 SC, 227 R, 241 R (56) References Cited

U.S. PATENT DOCUMENTS

| | | | |
|---|---|---|---|
| 3,061,744 | * 10/1962 | Spira | 315/291 |
| 3,306,275 | * 2/1967 | Hufton | 315/209 SC |
| 3,349,284 | * 10/1967 | Roberts | 361/256 |
| 3,367,314 | * 2/1968 | Hirosawa et al. | 315/209 SC |
| 3,596,133 | * 7/1971 | Warren | 315/209 SC |
| 5,002,034 | 3/1991 | Herden et al. | 123/643 |
| 5,053,913 | * 10/1991 | Lozito et al. | 361/257 |

FOREIGN PATENT DOCUMENTS

| | | |
|---|---|---|
| 37 31 412 A1 | 5/1988 | (DE) . |
| 214 756 | 8/1985 | (EP) . |
| 1108636 | 4/1968 | (GB) . |
| 1520501 | 8/1978 | (GB) . |

OTHER PUBLICATIONS

Streetman "Solid State Electronic Devices" 2$^{nd}$ ed. 1980 pp. 162–163.*
Bird et al. "An Introduction to Power Electronics" 1983 p. 9.*
Abstract of 58–211564 only Japan Dec. 9, 1983.
Lawatsch et al., "Protection of Thyristors Against Overvoltage with Breakover Diodes," *IEEE Transactions on Industry Applications*, vol. 24, No. 3, May/Jun. 1988.
English language abstract of German Patent No. DE 37 31 412 A1 prepared by Derwent World Patents Index database service.

* cited by examiner

*Primary Examiner*—Michael B Shingleton
(74) *Attorney, Agent, or Firm*—Leydig, Voit & Mayer, Ltd.

(57) ABSTRACT

A capacitive discharge ignition system is described that incorporates a two-terminal passive network for controlling the discharge of a capacitive energy storage device into an igniter plug, wherein the network comprises a solid-state switch for alternately providing high and low ohmic paths between the two terminals in order to selectively connect the capacitive energy storage device to the igniter plug. The passive network includes means responsive to a predetermined value of a voltage differential (ΔV) between the two terminals for effecting the switching of the path between the two terminals provided by the solid-state switch from a high ohmic value to a low ohmic value, thereby controllably discharging the capacitive energy storage device into the igniter plug. In the illustrated embodiment, the solid-state switch is a series of SCRs, each of whose anode is connected to the trigger input of the SCR by way of a breakover diode (BOD).

11 Claims, 5 Drawing Sheets

SOLID-STATE IGNITION SYSTEM USING TRUE VOLTAGE TRIGGERING

This is a continuation of application Ser. No. 07/943,928 filed on Sep. 11, 1992 now abandoned.

TECHNICAL FIELD OF THE INVENTION

This invention generally relates to ignition systems and more particularly relates to ignition systems that provide high energy ignition sparks at consistent voltage levels.

BACKGROUND OF THE INVENTION

Ignition systems for igniting fuel in turbine engines have been in wide use since the 1950s. Although a great variety of systems exists today, their basic architecture has remained fundamentally unchanged over time. The most typical ignition system for turbine engines is a capacitive discharge type. For this type of ignition system, a switch is typically employed to control the discharge of a storage capacitor into an igniter plug located in a combustion chamber of the gas turbine. Historically, a gas-filled device containing a spark gap has functioned as the switch in these ignition systems. Such devices provide a "passive" switch in that they do not require application of an external power supply in order to function properly. Instead, these devices simply employ a single input and output.

Normally, a gas-filled spark gap device comprises a pair of electrodes enclosed in a gas-tight housing together with some type of mildly radioactive emitter, which provides free ions. As energy is pumped into the storage capacitor of the ignition system, the charge on the capacitor causes an increasing electric field across the pair of electrodes in the spark gap. This field begins to ionize the gas within the housing. At some point in the ionization process, the gas begins to conduct current between the electrodes. The ionized gas then becomes a plasma whose electrical resistance drops substantially, thus allowing the current through the spark gap device to increase suddenly and, thereby, create a spark across the gap at the igniter plug. Thus the spark gap responds to reaching a preset voltage by switching from a high to a low impedance, and in that sense it is both a measurement device and a power switch.

For more recent designs, solid state switches have been substituted for the gas-filled spark gap devices. For example, U.S. Pat. No. 5,053,913 to Dolmovich illustrates a series of SCRs that function as an externally-triggered switch connecting the energy storage capacitor to the igniter plug. Another example of a solid-state switch in an ignition system for turbines is shown in U.S. Pat. No. 5,065,073 to Frus. Although these solid-state switches provide certain advantages with respect to the gas-filled spark discharge devices for reasons set forth in the above-identified patents, they require control circuitry, which increases the parts count for implementing an ignition system. Moreover, the control circuitry that is specifically used to externally trigger the SCR devices requires a regulated power supply. Using a nomenclature adopted herein, these type of solid-state switches are referred to as "active" switches.

One of the advantages of ignition systems employing gas-filled spark gap devices is the simplicity of the implementation of ignition systems using such switches. These switches do not require external control circuitry and, therefore, there is no need for additional circuitry. Using a nomenclature adopted herein, these type of switches are referred to as "passive" switches.

Although the gas discharge spark gap devices offer simplicity and reliable performance over a wide range of ambient conditions, they are not as reliable over time as the active switches that utilize solid-state circuitry. For example, the repeated generation of sparks by way of the ionization of the gas in the spark gap device necessarily results in the erosion of the electrodes, which causes the operating characteristics of the device to vary in time. Also, the gas in the spark gap devices deteriorates with time and repeated spark events. The deterioration of the gas adds to the changing discharge characteristics of the device. This gradual wear of the spark gap devices results in variable characteristics that are unpredictable in the near term and ultimately result in a slow and gradual deterioration of performance in the long term. Consequently, the gas discharge spark gap devices must be periodically inspected in order to ensure that the performance of the device has not so deteriorated as to affect the performance of the overall ignition system.

SUMMARY OF THE INVENTION

It is the primary object of the invention to provide a solid-state switch in a gas turbine ignition system that has both the traditional advantages offered by solid-state devices and the advantages of the simplicity of implementation achieved by the traditional gas-discharge spark gap devices used in gas turbine ignition systems.

It is another object of the invention to provide a direct replacement for the spark-gap device without changing the circuit in which it is utilized.

It is yet another object to provide a replacement for the spark-gap in A.C. powered ignition systems, where there is minimal circuitry other than a step-up transformer and high-voltage rectifier.

Other objects and advantages will become apparent upon reference to the following detailed description when taken in conjunction with the drawings.

Briefly, a capacitive discharge ignition system according to the invention includes a passive network comprising a solid-state switch for alternately providing high and low ohmic paths between the two terminals of the network, thereby selectively connecting a capacitive energy storage device to output circuitry of the ignition system. The network includes means responsive to a predetermined value of the voltage differential ($\Delta V$) across the two terminals of the network for effecting the switching of the path between high and low impedance, thereby controllably discharging the capacitive energy storage device into the igniter plug.

In the illustrated embodiment, the means responsive to the predetermined value of the voltage differential ($\Delta V$) across the two terminals of the network comprises series connected silicon-controlled rectifiers (SCRs), each of whose trigger/gate inputs is connected to the anode of the SCR by way of a breakover diode (BOD). The value of the breakover voltage ($V_B$) of the BOD is proportional to the predetermined value of the voltage ($\Delta V$) across the network at which the network breaks down to a low impedance path. Because there is only a small power throughput at the BOD, it can repeatably be used to trigger the associated SCR without affecting its reliability.

While the invention will be described in connection with a preferred embodiment and several alternate embodiments, there is no intent to limit it to those embodiments. On the contrary, the intent is to cover all alternatives, modifications, and equivalents following within the spirit and scope of the invention as defined by the appended claims.

DETAILED DESCRIPTION OF THE PREFERRED EMBODIMENT

Figure 1A:
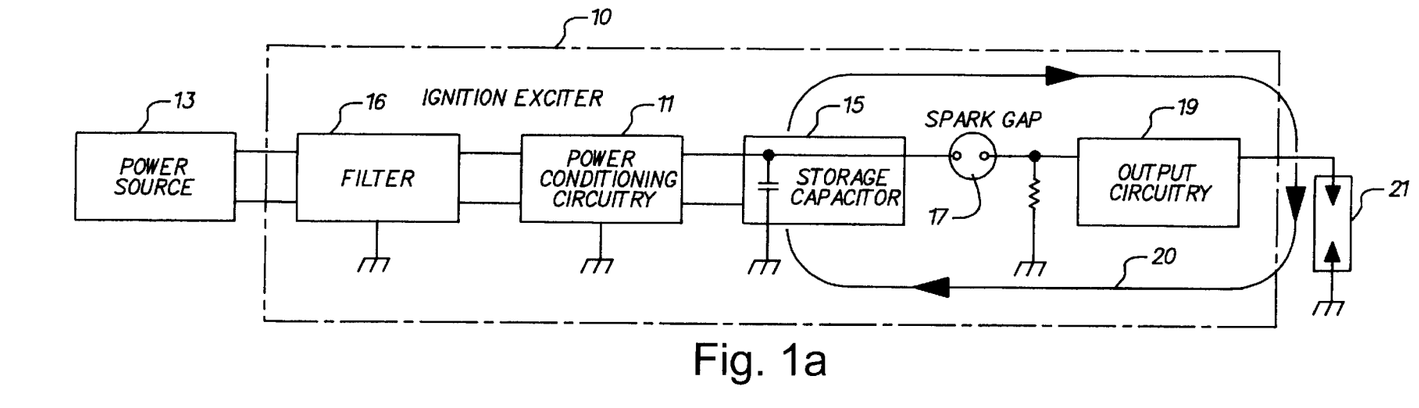
FIGS. 1a and 1b are schematic block diagrams of conventional capacitive discharge ignition systems employing a gas-discharge spark gap device.
Figure 1B:
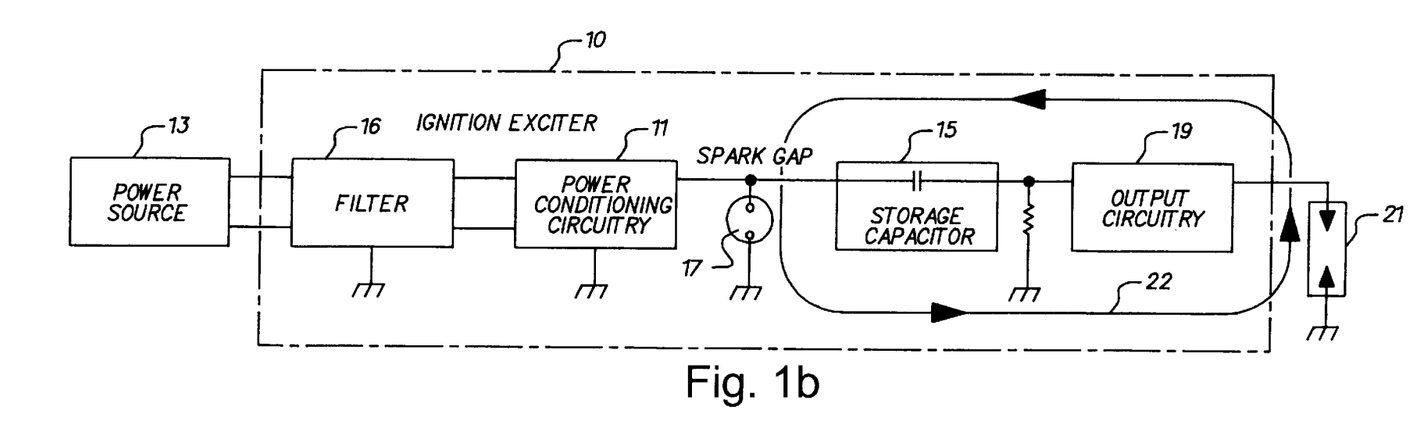

Turning to the drawings and referring first to FIGS. 1a and 1b, a conventional ignition system includes an exciter 10, a power source 13 and an igniter plug 21. In the exciter 10, power conditioning circuitry 11 pumps energy supplied from the power source 13 into a storage capacitor 15. The power conditioning circuitry 11 converts the relatively low voltage of the power source 13 (e.g., 28 volts) into a high voltage of for example, 2500 volts for storage by the storage capacitor 15. Many types of conditioning circuitry are known in the art. The conditioning circuitry 11 may incorporate traditional DC-to-DC converters or AC-to-DC converters, depending on the type of power source 13 employed. A broad band filter 16 is usually provided between the voltage source 13 and the conditioning circuitry 11, which prevents high frequency noise generated by the ignition system escaping to other electronics via the power source.

When the energy stored in the storage capacitor 15 has reached a predetermined level, a spark-gap device 17 first detects this voltage and then completes a low impedance path by which the energy stored in the capacitor 15 is delivered to the igniter plug 21 through the output circuitry 19. This energy generates a spark to ignite fuel in a combustion chamber of a turbine engine (not shown). The output circuitry 19 may provide for either a unipolar or a bipolar discharge of the stored energy into the igniter plug 21.

In concept, both embodiments illustrated in FIGS. 1a and 1b are functionally equivalent. In each of the embodiments, however, the locations of the spark gap device 17 and the storage capacitor 15 are transposed with respect to their locations in the other embodiment. In FIG. 1a, for example, the anode of the capacitor 15 is directly connected to the input of the output circuitry 19 when the spark gap device 17 completes its low impedance path. The resulting initial current flow is illustrated by the arrow 20 in FIG. 1a. In contrast, the spark gap device 17 in the embodiment of FIG. 1b directly connects the anode of the capacitor 15 to ground when the device completes its low impedance path, thereby creating a current flow 22 shown in FIG. 1b that is in the reverse direction from that of the current flow 20 in FIG. 1a. As will be appreciated by those skilled in the art, the current flows 20 and 22 illustrated in FIGS. 1a and 1b, respectively, reverse in time if the output circuitry 19 is of a conventional bipolar design.

In general, the spark gap device 17 connects the storage capacitor 15 to the output circuitry 19 by way of a low impedance path, which is completed by the device when the stored energy at the capacitor is sufficient to create a voltage that breaks down the gap in the device. In both architectures of FIGS. 1a and 1b, the storage capacitor 15 is connected across the output circuitry 19 between the input to the circuitry and ground. In the architecture of FIG. 1a, the spark gap device 17 selectively connects the input of the output circuitry 19 to the anode of the capacitor 15, thereby completing the circuit between the capacitor and the output circuitry. In the architecture of FIG. 1b, the spark gap device 17 selectively connects the anode of the capacitor 15 to ground in order to complete the same circuit. The energy stored in capacitor 15 is typically two to 20 joules for turbine ignition applications.

Figure 3A:
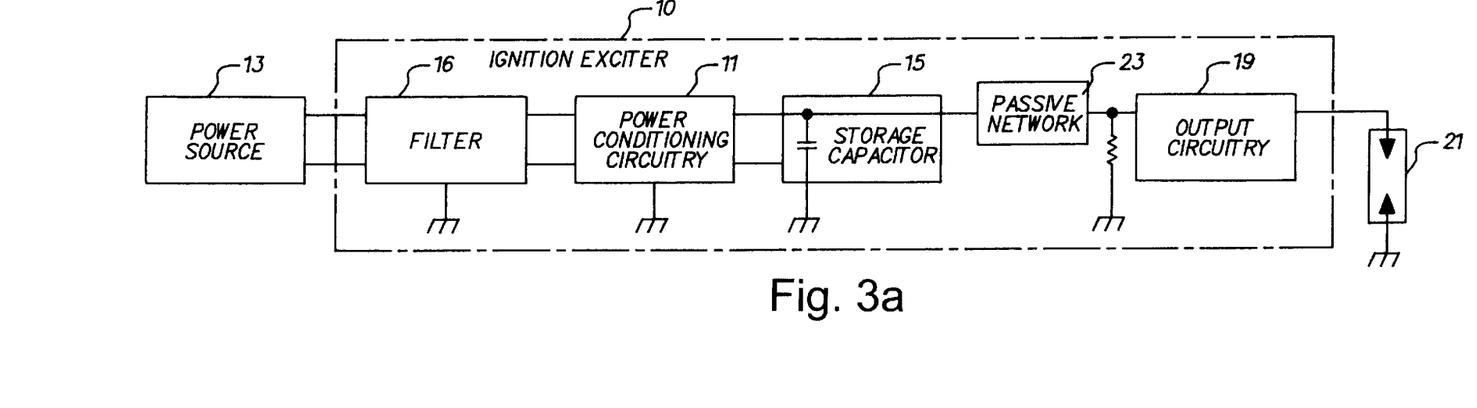
FIGS. 3a and 3b are schematic block diagrams of the capacitive discharge ignition systems of FIG. 1, where the spark gap device has been replaced by a passive solid-state network according to the invention.
Figure 3B:
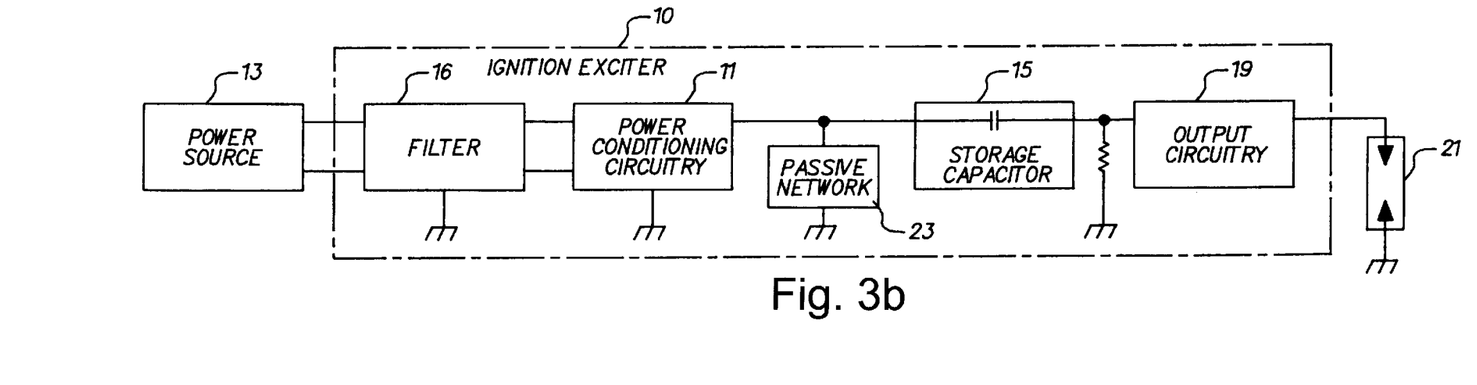

In accordance with one important aspect of the invention, a passive solid-state network 23 is directly substituted for the spark gap device 17 as suggested by FIGS. 3a and 3b. In FIGS. 3a and 3b, the exciter is identified as 10' in contrast to the exciter 10 in FIGS. 1a and 1b, reflecting the substitution of the passive solid-state network 23 for the spark gap device 17. The network 23 is "passive" in that, like the spark gap device 17, it is a two-terminal device that has no inputs or outputs other than an input from the storage capacitor 15 and an output to the output circuit 19. The network 23 comprises a solid-state switch, shown in FIG. 4, for alternately providing high and low ohmic paths to complete the circuit between the storage capacitor 15 and the output circuitry 19. When a voltage difference ($\Delta V$) across the network 23 reaches a predetermined value, the network switches from the high ohmic path connecting the capacitor 15 and the output circuitry 19 to the low ohmic path, thus controllably discharging the capacitor into the output circuitry and the igniter plug 21 only after a predetermined amount of energy has been stored by the capacitor. The passive network 23 has the advantage of the simplicity of a standard spark gap device with the added advantage of the reliability of solid state circuitry.

Like the spark gap device 17, the passive network 23 triggers the discharge of the storage capacitor 15 in response to a predetermined value of the voltage ($\Delta V$) across it. Unlike the spark gap device 17, however, the predetermined voltage remains substantially constant over the life of the network 23, and can be "adjusted" at the time of manufacture to a range of self-triggering voltage by a simple modification of component values in the network.

Figure 2:
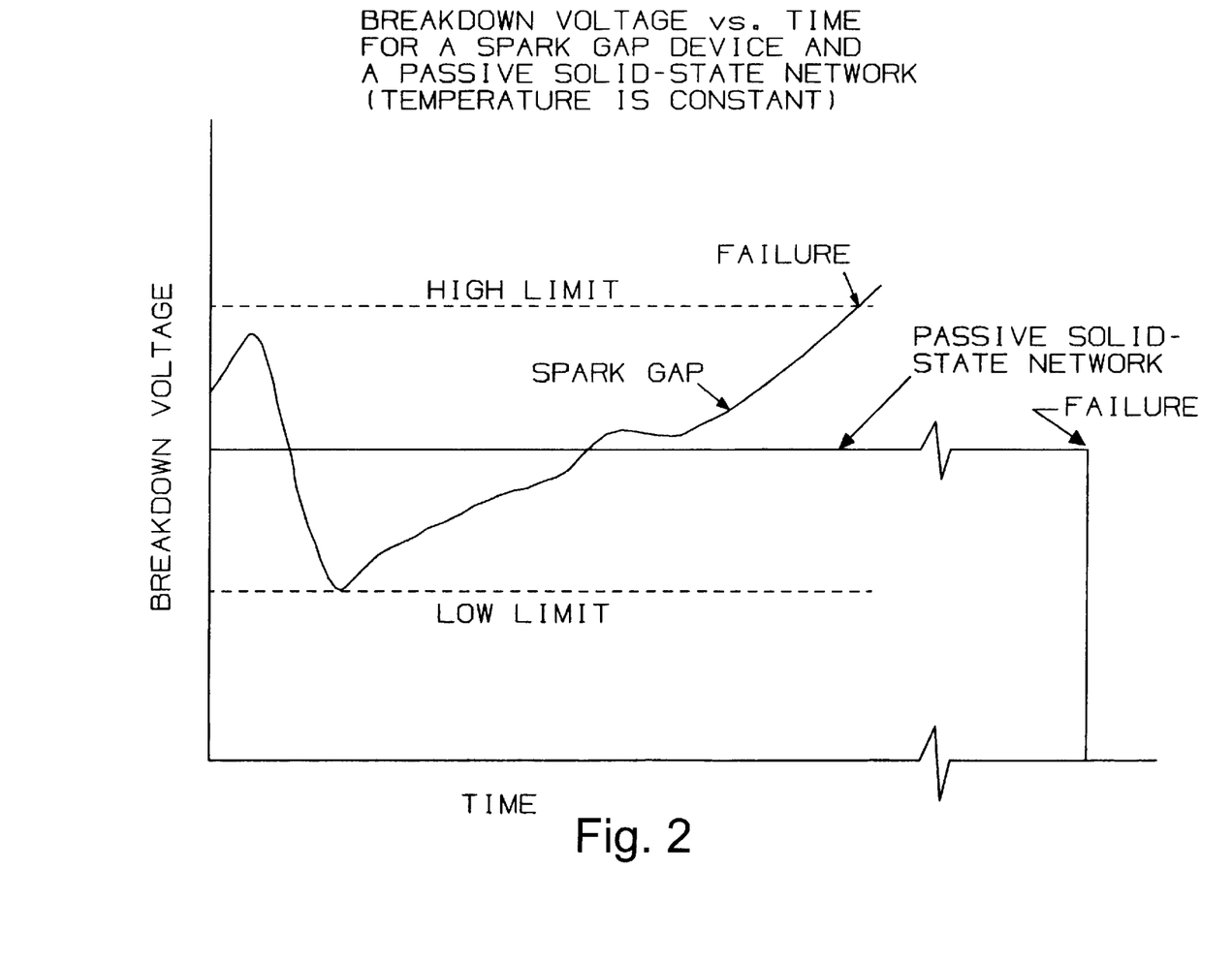
FIG. 2 is an exemplary graph illustrating and comparing the discharge voltage of a spark gap device and the discharge voltage of a passive solid-state network according to the invention for a time period that includes the useful life of both devices.

Referring to the exemplary graph of FIG. 2, the value of the breakdown voltage of a typical spark gap device 17 varies over the useful life of the device between high and low limits set as design criteria for the ignition system. As FIG. 2 indicates, the value of the breakdown voltage may vary over the entirety of the range of values between the high and low limits during the life of the device. In fact, some devices may even fire prematurely for a time as indicated by a dipping of the breakdown voltage below the low limit, and require a burn-in period to surpass this region before introduction into service.

In contrast to the behavior of the value of the breakdown voltage in the spark gap device 17, the breakdown voltage of the solid-state circuitry of the passive network 23 maintains a substantially constant value over the life of the network. When the network 23 fails, its failure is typically abrupt as indicated in FIG. 2 rather than the gradual deterioration of the spark gap device 17.

In keeping with the invention, the output circuitry 19 is of a unipolar type in order to match the unipolar characteristics of the network 23, which is substantially made up of unipolar semiconductor devices as discussed hereinafter in connection with FIG. 4. An exemplary unidirectional output circuit is illustrated in the aforementioned U.S. Pat. No.

5,065,073 to Frus, which uses an inductor in series connection with the igniter plug 21 and a clamping or "freewheeling" diode in anti-parallel with the series pair of inductor and igniter plug. Alternative conventional architectures for the output circuitry 19 may also be used —e.g., a capacitor, transformer and igniter combination with a diode in parallel with the combination.

Figure 4:
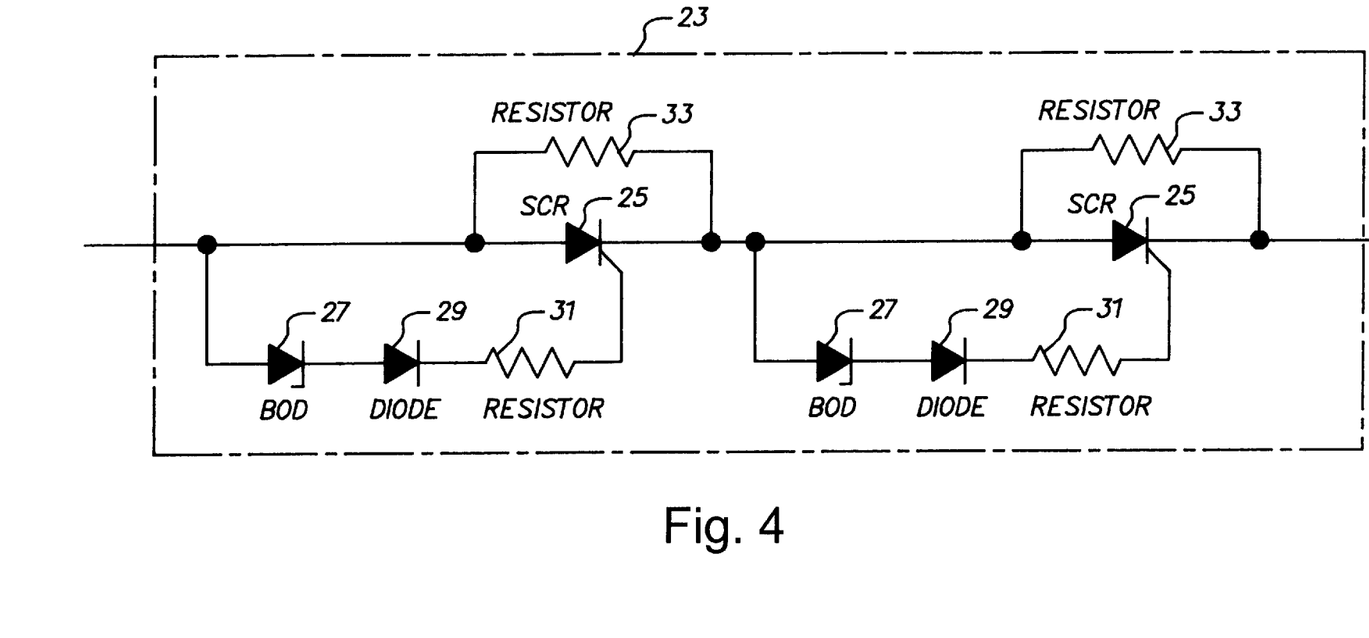
FIG. 4 is a circuit diagram of an embodiment of the passive solid-state network shown in FIGS. 3a and 3b.

Referring to FIG. 4, in implementing the passive network 23, one or more silicon-controlled rectifiers 25 (SCRs) are arranged to have their trigger inputs connected to the anode of the SCR by way of a conventional breakover diode 27 (BOD). As suggested by FIG. 4, the network 23 may comprise a plurality of stages of BOD triggered SCRs. In the illustrated embodiment of FIG. 4, the network 23 is formed by two (2) of these stages in series connection. It will be appreciated by those skilled in the art of gas turbine ignition systems that the number of series connected SCRs 25 in the network 23 depends on the desired breakdown voltage for the exciter 10' and the power and voltage ratings of the SCRs employed in the network.

Each SCR 25 has an input and output that define input and output terminals of the alternatively high and low impedance path. In a well known manner, a trigger or gate input controls conversion of the path from high to low impedance. In a series connection, the input of the first SCR 25 is the input terminal of the network 23 and the output of the last SCR is the output terminal of the network. As used herein, a "series" of SCRs 25 includes a single SCR as well as the more likely two (2) or more as suggested by the illustrated embodiment. Those skilled in the art will appreciate that a single SCR 25 could be employed in the network 23 if its voltage rating was adequate for this application. To the best of applicant's knowledge, however, reliable and inexpensive SCRs of this character are not now available to meet the voltage requirements normally specified for such ignition systems.

As the illustrated embodiment suggests, each SCR 25 in the network 23 is associated with a BOD 27 and related circuitry. For convenience of discussion, each pair of SCR 23 and BOD 27 and their associated circuitry are called a "stage" of the passive network 23. The following discussion is directed to one of the stages, with the understanding that each of the stages functions the same as the others. Although reference will hereinafter be made to only one of the two illustrated stages, the BODs and associated circuitry of both SCRs 25 are numbered identically in order to emphasize that they are identically illustrated stages, configured and functioning the same. An example of an appropriate SCR 23 is a CS8-12io2 by ABB-IXYS Semiconductor. An example of an appropriate BOD 27 is a BOD1-10 from ABB High Power Semiconductors.

When the voltage across the BOD 27 reaches the breakover value ($V_B$), the BOD turns on and begins to conduct. The BOD 27 operates like an SCR in that it exhibits a low voltage drop when it is on, and it stays on until the current through the BOD drops below a "holding" current level. When the BOD turns on, it triggers the SCR 25, which also then turns on. As soon as the SCR 25 turns on, the current to the gate of the SCR drops to near zero because the path through the SCR is of much lower impedance. The SCR 25 remains on even though the BOD 27 is not since the SCR does not need continued drive current to its gate after it turns on. In practice, the power throughput at the BOD 27 is minimal (e.g., a maximum of 1.8 amps peak for less than 10 microseconds total duration) and allows the BOD to operate repeatedly as a triggering device. In contrast to their application here, typically BODs function as protective safety devices that are not used during normal operation. Reference: "Protection of Thyristors Against Overvoltage with Breakover Diodes" by Herbert M. Lawatsch, Janis Vitins published in IEEE Transactions on Industry Applications, Vol. 24, No. 3 May/June 1988.

For each stage of the passive network 23, the BOD 27 may require a series-connected conventional fast recovery diode 29 to protect the BOD from any possible reverse current that might be forced out of the gate of the SCR 25 during discharge of the capacitor 15. A resistor 31 in series with the BOD 27 and the diode 29 are required to limit the current through this path and into the gate of the SCR 25. A second resistor 33 in parallel with the SCR 25 provides voltage compensation by tending to keep the total voltage across the passive network 23 evenly divided between the stages.

Figure 5A:
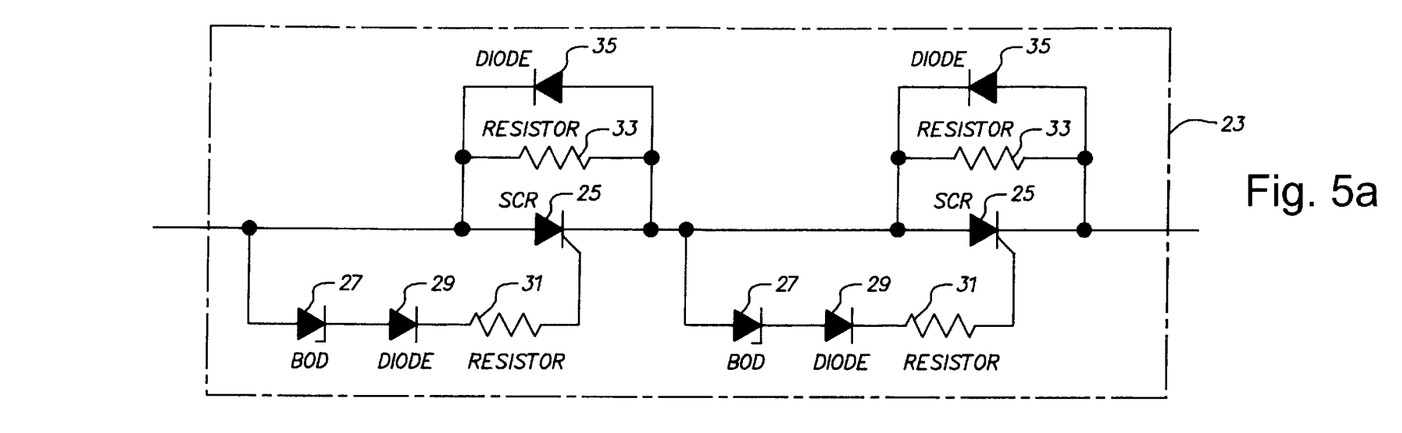
FIGS. 5a and 5b are circuit diagrams of alternative embodiments of the passive solid-state network shown in FIG. 4.

In the alternative embodiment of FIG. 5a, a reverse diode 35 capable of conducting the same current as the SCR 25 is employed either to shunt damaging reverse current, or to provide at least one oscillation of the output current. This embodiment employs conventional oscillatory output circuitry without a free-wheeling diode.

In applications such as aircraft engines where an ignition system incorporating the invention is exposed to temperature extremes, the breakdown voltage of the BOD 27 can vary in value. Typically, gas turbine ignition systems in aircraft are exposed to high temperatures in the area of 250 degrees F. With increasing temperature, the BODs 27 tend to be characterized by increasing values of their breakdown voltage ($V_B$), which results in an increase in the value of the voltage ($\Delta V$) at which the network 23 converts to a low ohmic path. By including in the network 23 a BOD 27 that has a lower breakdown voltage ($V_B$) than the other BODs in the network 23 so that it fires alone, a temperature compensation scheme can be implemented.

Figure 5B:
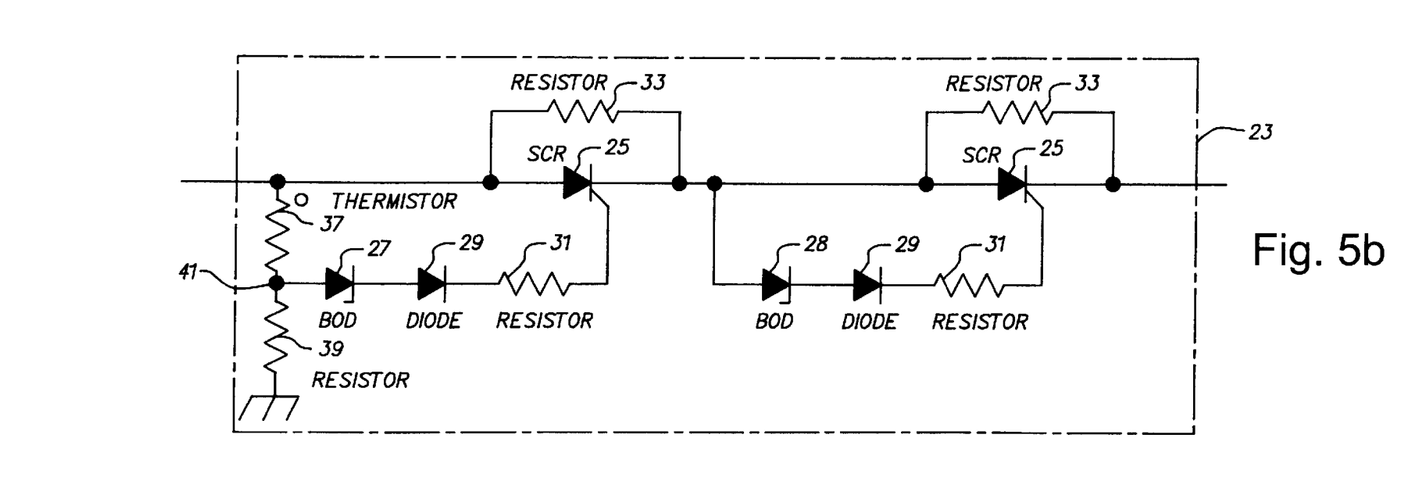

In the embodiment of FIG. 5b, the network of FIG. 5a has been modified to include temperature compensation means comprising series connected thermistor 37 and resistor 39, which define a voltage divider network. The network interfaces the BOD 27 to the input of the SCR 25. The thermistor 37 is selected to have a characteristic impedance over a range of possible ambient temperatures that complements the value of the breakdown voltage ($V_B$) for the BOD 27 over the same range of temperatures. Assuming a static condition of the ignition system with the only variable being the ambient temperature, an increase in the ambient temperature ($\Delta T$) decreases the value of the resistance of the thermistor 37. The incremental decrease in the resistance of the thermistor 37 results in an incremental increase of the voltage at the node 41 between the thermistor and the resistor 39 that approximately matches the incremental increase in the breakdown voltage ($V_B$) of the BOD 27.

Only one of the stages of the passive network 23 needs to be temperature compensated. When the temperature compensated stage breaks down, the other stages quickly breakdown in a cascading sequence, even though the breakdown voltages ($V_B$) of the BODs in the other stages are raised due to the increased temperature ($\Delta T$). The other BODs 28 break down because the voltage that previously appeared across the temperature compensated SCR 25, now is redistributed and appears across the SCRs and BODs of the other stages. In other words, the value of the voltage ($\Delta V$) across the network 23 is redistributed across the other BODs 28, resulting in an incremental increase in the voltage across each of the other BODs. By design, the incremental increase in voltage across each of the BODs 28 resulting from the breakdown of the temperature compensated SCR 25 must be greater than the incremental increase in the breakdown voltage ($V_B$) of each BOD caused by $\Delta T$. As will be appreciated by those skilled in the art, adequate voltage margins must be designed into the temperature compensated network 23 to ensure reliable operation. Other types of well-known temperature compensation networks may also be used. Reference: L. R. Rice, *Silicon Controlled Rectifier Designers Handbook,* Chapter 9.0, second edition, Westinghouse Electric Corporation, Youngwood, Pa. (Sep. 1970).

In keeping with the invention, matching operating characteristics of individual SCRs 25 used in the series of connected stages may be beneficial. For example, if the ignition system is exposed to temperature extremes, the SCRs 25 preferably have leakage current characteristics that are equal in order to maintain an even distribution across the SCRs of the voltage ($\Delta V$) from capacitor 15 and thereby avoid over stressing one or more of the SCRs in the series connection.

From the foregoing, it can be appreciated that a capacitive discharge ignition system incorporating the passive network 23 has the advantages of a fully solid-state device while at the same time minimizing the parts count necessary to implement the function of a controlled discharging of the capacitive storage device in the ignition system. Specifically, the solid-state passive network 23 is a two-terminal device that does not require external control circuitry. Furthermore, by providing adequate compensation schemes, the passive network 23 may be employed in applications of the ignition system that expose the system to severe environmental conditions, which are typically assumed to be appropriate only for ignition systems incorporating spark gap devices.

What is claimed is:

1. A capacitive discharge ignition system responsive to a power source for igniting fuel to power a turbine engine, the system comprising:

a capacitive energy storage device;

power conditioning circuitry responsive to the power source for pumping power into the capacitive energy storage device;

an igniter plug for igniting the fuel;

output circuitry for delivering the energy from the capacitive energy storage device to the plug; and a passive network having only two terminals, the terminals connecting the network in series with the capacitive storage device and the output circuitry for selectively completing a low impedance path for discharging the capacitive energy storage device to the igniter plug;

the passive network including a first SCR for selectively providing high and low impedance paths between the two terminals of the passive network to selectively discharge the capacitive energy storage device into the output circuitry and the igniter plug, the first SCR having an input and a trigger input; and, a breakover diode connected in a forwardly biased manner between the input of the first SCR and the trigger input of the first SCR, the at least one breakover diode being responsive to a predetermined value of a voltage differential ($\Delta \nabla$) between the two terminals of the passive network for switching the first SCR from the high impedance path to the low impedance path to controllably discharge the capacitive energy storage device to the igniter plug.

2. A capacitive discharge ignition system as set forth in claim 1 further comprising a second SCR with an associated breakover diode, the second SCR being connected in series with the first SCR to provide a cascade of stages for selectively energizing the output circuitry and the igniter plug.

3. A capacitive discharge ignition system as set forth in claim 1 wherein the passive network includes means for compensating for changes in the predetermined value of the voltage ($\Delta V$) as a function of changing ambient temperature ($\Delta T$).

4. A capacitive discharge ignition system as set forth in claim 3 wherein the compensating means includes a thermistor.

5. A capacitive discharge ignition system as set forth in claim 1 wherein the first SCR and its associated breakover diode include means for compensating for changes in the predetermined value of the voltage ($\Delta V$) as a function of changing ambient temperature ($\Delta T$).

6. A capacitive discharge ignition system as set forth in claim 5 wherein the compensating means is a thermistor in series with a resistor, which defines a voltage divider network interfacing the breakover diode to the input of the first SCR.

7. A capacitive discharge ignition system as set forth in claim 1 wherein the passive network includes a diode connected in parallel with the first SCR, the diode being connected in reversed polarity with respect to the SCR in order to provide a path for reverse current flow to accommodate a bipolar discharge at the igniter plug.

8. A capacitive discharge ignition system responsive to a power source for igniting fuel to power a turbine engine, the system comprising: a capacitive energy storage device; power conditioning circuitry responsive to the power source for pumping energy into the capacitive energy storage device; an igniter plug for transforming the energy stored in the capacitive storage device into a spark for igniting the fuel to power the turbine engine; output circuitry for delivering the energy from the energy storage device to the igniter plug; a passive network responsive to a voltage differential ($\Delta V$) of approximately 2500 volts or more between input and output terminals of the network for completing a low impedance path between the capacitive energy storage device and the output circuitry, where the passive network is completely isolated from the remainder of the system except by way of the input and output terminals; and the passive network comprises (1) a solid-state switch for alternately providing high and low impedance paths between the input and output terminals, thereby selectively discharging the energy from the capacitive energy storage device into the igniter plug, and (2) a breakover diode responsive to the voltage differential ($\Delta V$) between the input and output terminals for switching the path between the two terminals provided by the solid-state switch from a high impedance value to a low impedance value, thereby controllably discharging the energy from the capacitive energy storage device to the igniter plug by way of the output circuitry.

9. A capacitive discharge ignition system responsive to a power source for igniting fuel to power a turbine engine, the system comprising: a capacitive energy storage device; power conditioning circuitry responsive to the power source for pumping energy into the capacitive energy storage device; an igniter plug for transforming the energy in the capacitive energy storage device into a spark for igniting the fuel to power the turbine engine; output circuitry for delivering the energy from the energy storage device to the plug; a passive network responsive to a voltage differential ($\Delta V$) between input and output terminals of the network for completing a low impedance path to discharge the capacitive energy storage device, where the passive network is electrically isolated except for the input and output terminals; and the passive network comprises: (1) a solid-state switch for alternately providing high and low impedance paths between the input and output terminals, thereby selectively discharging the energy in the capacitive energy storage device into the output circuitry and the igniter plug, and (2) a breakover diode (BOD) responsive to the voltage differential ($\Delta V$) between the input and output terminals for effecting the switching of the path between the two terminals provided by the solid-state switch from a high impedance value to a low impedance value, thereby controllably discharging the energy stored in the capacitive energy storage device to the igniter plug by way of the output circuitry, where the BOD includes an anode connected to the input terminal and a cathode connected to a trigger input of the solid-state switch.

10. A capacitive discharge ignition system responsive to a power source for igniting fuel to power a turbine engine, the system comprising: a capacitive energy storage device; power conditioning circuitry responsive to the power source for pumping approximately two joules or more of energy into the capacitive energy storage device; an igniter plug for igniting the fuel; output circuitry for delivering the energy from the energy storage device to the plug; a passive network having only two terminals which connect the network to the capacitive energy storage device and the output circuitry for completing a path discharging the capacitive energy storage device into the igniter plug; the passive network comprising (1) a solid-state switch for alternately providing high and low impedance paths between the two terminals, thereby selectively discharging the capacitive energy storage device into the output circuitry and the igniter plug, and (2) a breakover diode responsive to a predetermined value of a voltage differential ($\Delta V$) between the two terminals for effecting the switching of the path between the two terminals provided by the solid-state switch from a high impedance value to a low impedance value, thereby controllably discharging the capacitive energy storage device into a spark gap of the igniter plug by way of the output circuitry.

11. A capacitive discharge ignition system as set forth in claim 1 wherein the output circuitry has only two terminals, with one terminal receiving a discharge current from the capacitive energy storage device and the other terminal sourcing the discharge current.

* * * * *